United States Patent
Kang et al.

(10) Patent No.: US 11,332,848 B2
(45) Date of Patent: May 17, 2022

(54) SILICON SINGLE CRYSTAL GROWTH METHOD AND APPARATUS

(71) Applicant: SK SILTRON CO., LTD., Gumi-si Gyeongsangbuk-do (KR)

(72) Inventors: Jong Min Kang, Gumi-si (KR); Il Soo Choi, Gumi-si (KR)

(73) Assignee: SK Siltron Co., Ltd., Gumi-Si (KR)

( * ) Notice: Subject to any disclaimer, the term of this patent is extended or adjusted under 35 U.S.C. 154(b) by 69 days.

(21) Appl. No.: 16/959,852

(22) PCT Filed: Jan. 18, 2019

(86) PCT No.: PCT/KR2019/000753
§ 371 (c)(1),
(2) Date: Jul. 2, 2020

(87) PCT Pub. No.: WO2019/143175
PCT Pub. Date: Jul. 25, 2019

(65) Prior Publication Data
US 2021/0372002 A1  Dec. 2, 2021

(30) Foreign Application Priority Data

Jan. 19, 2018  (KR) .................. 10-2018-0006990

(51) Int. Cl.
*C30B 15/10* (2006.01)
*C30B 15/22* (2006.01)
(Continued)

(52) U.S. Cl.
CPC .............. *C30B 15/22* (2013.01); *C30B 15/10* (2013.01); *C30B 15/36* (2013.01); *C30B 29/06* (2013.01)

(58) Field of Classification Search
CPC ......... C30B 15/22; C30B 16/10; C30B 15/36; C30B 29/06; Y10T 117/1072
See application file for complete search history.

(56) References Cited

U.S. PATENT DOCUMENTS

| 6,869,477 B2 * | 3/2005 | Haga ....................... C30B 29/06 117/13 |
| 2003/0209186 A1 * | 11/2003 | Haga ....................... C30B 29/06 117/13 |

(Continued)

FOREIGN PATENT DOCUMENTS

| CN | 103060900 | 4/2013 |
| CN | 107109686 | 8/2017 |

(Continued)

OTHER PUBLICATIONS

International Search Report (with English Translation) and Written Opinion dated Apr. 24, 2019 issued in Application No. PCT/KR2019/000753.

(Continued)

*Primary Examiner* — Robert M Kunemund
(74) *Attorney, Agent, or Firm* — KED & Associates LLP (57) ABSTRACT

An embodiment provides a silicon single crystal growth method comprising the steps of: (a) allowing the shoulder of a single crystal to grow vertically; (b) allowing the shoulder to grow horizontally after the vertical growth; and (c) allowing the shoulder to grow in a downward convex shape after the horizontal growth of the shoulder, wherein the shoulder grows at a preset rate on the basis of the final diameter of the shoulder and the shoulder growth height according to steps (b) and (c).

3 Claims, 7 Drawing Sheets

(51) Int. Cl.
      *C30B 15/36*          (2006.01)
      *C30B 29/06*          (2006.01)

(56) References Cited

U.S. PATENT DOCUMENTS

| | | |
|---|---|---|
| 2009/0038537 A1 | 2/2009 | Minami |
| 2010/0116194 A1* | 5/2010 | Togawa .................. C30B 15/22 |
| | | 117/13 |
| 2018/0002827 A1 | 1/2018 | Kang et al. |

FOREIGN PATENT DOCUMENTS

| | | |
|---|---|---|
| JP | H10-139584 | 5/1998 |
| JP | H11-180793 | 7/1999 |
| JP | H11-322492 | 11/1999 |
| JP | 2009-292662 | 12/2009 |
| JP | 2010-013303 | 1/2010 |
| JP | 4569103 | 10/2010 |
| KR | 10-2009-0014957 | 2/2009 |
| KR | 10-2009-0078234 | 7/2009 |
| KR | 10-1193653 | 10/2012 |
| KR | 10-2013-0119583 | 11/2013 |
| KR | 10-2016-0084987 | 7/2016 |

OTHER PUBLICATIONS

Chinese Office Action dated Jun. 3, 2021 issued in Application No. 201980008970.7 (English translation attached).
Japanese Office Action dated Jul. 20, 2021 issued in Application No. 2020-536770.

\* cited by examiner

SILICON SINGLE CRYSTAL GROWTH METHOD AND APPARATUS

CROSS-REFERENCE TO RELATED PATENT APPLICATIONS

This application is a U.S. National Stage Application under 35 U.S.C. § 371 of PCT Application No. PCT/KR2019/000753, filed Jan. 18, 2019, which claims priority to Korean Patent Application No. 10-2018-0006990, filed Jan. 19, 2018, whose entire disclosures are hereby incorporated by reference.

TECHNICAL FIELD

Embodiments relate to a silicon single crystal growth method and apparatus which may stably control an oxygen concentration in a single crystal ingot.

BACKGROUND ART

Contents which will be described hereinafter serve simply to provide background information of embodiments and do not constitute the related art.

In general, as a method for manufacturing single crystal silicon, a Floating Zone (FZ) method or Czochralski (CZ) method is widely used at present. When growing a single crystal ingot using the FZ method, it is difficult to manufacture a silicon wafer having a large caliber and processing costs are very high, and thus, the CZ method is generally used to grow a single crystal ingot.

In the CZ method, poly silicon is inserted into a quartz crucible and is melted by a graphite heater, a seed crystal is immersed into a silicon melt formed as a result of melting, and the seed crystal is rotated and pulled such that crystallization is carried out on a silicon melt interface, thereby growing a single crystal ingot.

Figure 1:
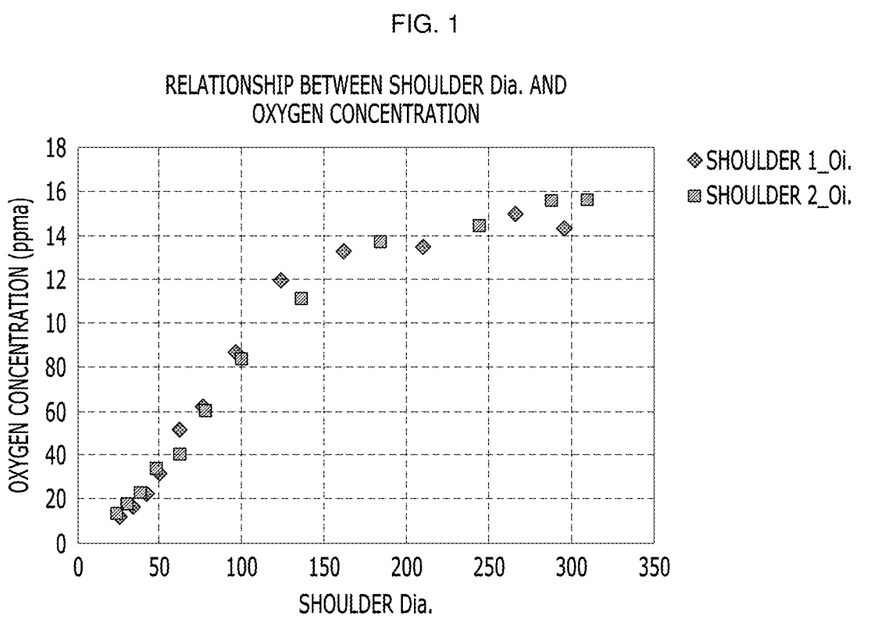
FIG. 1 is a graph showing the relationship between the diameter of a conventional shoulder and an oxygen concentration.

FIG. 1 is a graph showing the relationship between the diameter of a conventional shoulder and an oxygen concentration.

Referring to FIG. 1, the oxygen concentration is reduced as oxygen is volatilized from the surface of a silicon melt to the outside. However, as the shoulder is grown, the increased diameter of the shoulder covers the surface of the silicon melt, an area through which oxygen may be volatilized is reduced, the non-volatilized oxygen is introduced into the shoulder as the shoulder is grown, and thus, the oxygen concentration may be increased during the growth of the shoulder.

The conventional silicon single crystal growth method and apparatus do not take into account volatilization of oxygen according to the increase in the diameter of the shoulder, and therefore, although an initial oxygen concentration of the silicon ingot at a diameter part thereof is controllable, control of an oxygen concentration in an in-plane direction is not considered.

DISCLOSURE

Technical Problem

Embodiments provide a silicon single crystal growth method in which the pulling speed of a pulling unit is controlled such that the final diameter of the shoulder of a single crystal and the height of the shoulder from a horizontal growth starting portion of the shoulder up to a point in time of growth completion of the shoulder realize a preset ratio therebetween, so as to stably control an oxygen concentration during growth of the single crystal.

Technical objects to be achieved by the embodiments are not limited to the above-described objects, and additional advantages, objects, and features of the embodiments will be set forth in part in the description which follows and in part will become apparent to those having ordinary skill in the art upon examination of the following or may be learned from practice of the embodiments.

Technical Solution

In one embodiment, a silicon single crystal growth method includes the steps of: (a) allowing a shoulder of a single crystal to grow vertically; (b) allowing the shoulder to grow horizontally after the vertical growth; and (c) allowing the shoulder to grow in a downwardly convex shape after the horizontal growth of the shoulder, wherein the shoulder grows to realize at a preset ratio between a final diameter of the shoulder and a growth height of the shoulder according to the steps (b) and (c).

In the step (a), the shoulder may grow at a first puling speed, and in the steps (b) and (c), the shoulder may grow at a second pulling speed.

The first pulling speed may be an average pulling speed at which the shoulder reaches 70% of a final height of the shoulder.

The second pulling speed may be 1.125-1.375 times the first pulling speed.

A height of the shoulder grown in the step (b) may be greater than a height of the shoulder grown in the step (c).

A ratio of a height of the shoulder grown in the step (b) to the final diameter of the shoulder may be 0.3 or more.

The height of the shoulder grown in the step (b) may be 90 mm or more.

In another embodiment, a silicon single crystal growth apparatus includes a crucible configured to receive a silicon melt, a pulling unit configured to pull a single crystal from the silicon melt received in the crucible, and a controller configured to control a pulling speed of the single crystal, wherein the controller controls the pulling unit such that a shoulder of the single crystal grows vertically, the shoulder grows horizontally after the vertical growth, and the shoulder grows in a downwardly convex shape after the horizontal growth of the shoulder.

The controller may control the pulling speed of the single crystal using the pulling unit such that a final diameter of the shoulder and a height of the shoulder from a horizontal growth starting portion of the shoulder up to a point in time of growth completion of the shoulder realize a preset ratio therebetween.

The aspects of the present invention are only some of exemplary embodiments of the present invention, and various embodiments in which technical features of the present invention are reflected may be deduced and understood by those skilled in the art based on the following detailed description of the invention.

Advantageous Effects

A silicon single crystal growth method according to one embodiment of the present invention has the following effects.

In the silicon single crystal growth method according to one embodiment, an oxygen concentration level in a body starting portion of a single crystal ingot is determined and an emission gradient of the oxygen concentration in the body starting portion is determined, thereby being capable of realizing good quality.

Effects which can be acquired by the present invention are not limited to the above-described effects, and other unmentioned effects will be apparent to those skilled in the art from descriptions herein below.

DESCRIPTION OF DRAWINGS

The accompanying drawings, which are included to provide a further understanding of the invention, illustrate embodiments of the invention together with the following detailed description of the embodiments. However, the technical features of the present invention are not limited to specific figures, and features disclosed in the respective figures may be combined to form new embodiments.

BEST MODE

A silicon single crystal growth method according to one embodiment includes the steps of: (a) allowing the shoulder of a single crystal to grow vertically; (b) allowing the shoulder to grow horizontally after the vertical growth; and (c) allowing the shoulder to grow in a downward convex shape after the horizontal growth of the shoulder, wherein the shoulder grows to realize a preset ratio between the final diameter of the shoulder and the growth height of the shoulder according to the steps (b) and (c).

MODE FOR INVENTION

Reference will now be made in detail to the exemplary embodiments of the present invention, examples of which are illustrated in the accompanying drawings.

However, the present invention may be embodied in many alternative forms and should not be construed as being limited to the embodiments set forth herein. The embodiments of the present invention are provided only to completely disclose the invention and to completely inform those skilled in the art of the scope of the invention.

Further, in the following description of the embodiments, relational terms, such as "first", "second", "upper", "lower" and the like, do not always require or imply any physical or logical relationship between substances or elements or a sequence or order thereof, and may be used only to distinguish one substance or element from other substance(s) or element(s).

Figure 2:
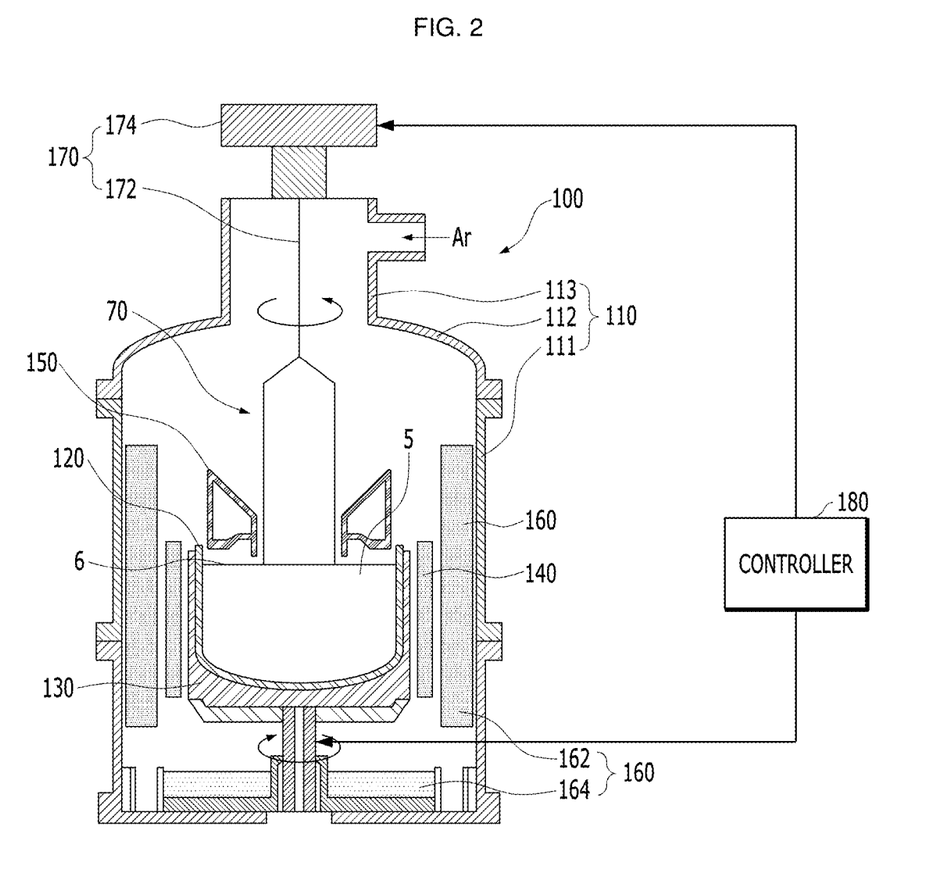
FIG. 2 is a view illustrating a silicon single crystal growth apparatus according to one embodiment of the present invention.

FIG. 2 is a view illustrating a silicon single crystal growth apparatus according to one embodiment of the present invention.

Referring to FIG. 2, a silicon single crystal growth apparatus 100 may include a chamber 110, a crucible 120, a crucible support 130, a heater 140, a heat shield 150, an insulting material 160, a pulling unit 170 and a controller 180.

The chamber 110 may include a body chamber 111, a dome chamber 112 and a pull chamber 113 according to coupled positions thereof.

The crucible 120 may be installed within the body chamber 111, and the dome chamber 112 may form a lid part at the upper end of the body chamber 111. The body chamber 111 and the dome chamber 112 provide an environment in which polycrystalline silicon grows into a silicon single crystal ingot, and may have a cylindrical shape having a reception space formed therein. The pull chamber 113 is located at the upper end of the dome chamber 112, and may form a space in which the grown silicon single crystal ingot is pulled.

The crucible 120 may be arranged within the body chamber 111, and be formed of quartz. The crucible support 130 may be located under the crucible 120 so as to support and rotate the crucible 120, and be formed of graphite.

The heater 140 may be arranged within the body chamber 111 so as to be spaced apart from the outer circumferential surface of the crucible 120, and heat the crucible 120.

The heat shield 150 may be arranged above the crucible 120, block heat radiated from a silicon melt 5 to a silicon single crystal 70, and prevent impurities generated from the heater 140 from penetrating into the silicon single crystal 70.

The insulating material 160 may be installed between the heater 140 and the inner wall of the body chamber 111. The insulating material 160 may prevent the heat of the heater 140 from leaking to the outside of the body chamber 111. The insulating material 160 may include a side insulating material and a lower insulating material.

The pulling unit 170 may include a fixing part 172 configured to fix an object, and a pulling part 174 configured to raise or lower the object. The fixing part 172 may be a cable type or a shaft type. The pulling part 174 may raise or lower the fixing part 172 using a motor or the like, and rotate the fixing part 172 in a designated direction. That is, the pulling unit 170 may rotate the growing single crystal ingot 70.

The controller 180 may control the pulling unit 170 such that a shoulder 200 of the single crystal grows vertically, the shoulder 200 grows horizontally after the vertical growth, and then the shoulder 200 grows into a downwardly convex shape after the horizontal growth of the shoulder 200.

The controller 180 may control the pulling speed of the pulling unit such that the final diameter of the shoulder 200 and the height of the shoulder 200 from a horizontal growth starting portion of the shoulder 200 up to a point in time of growth completion of the shoulder 200 realize a preset ratio therebetween.

The controller 180 may control the pulling speed of the pulling unit such that the ratio of the final diameter of the shoulder 200 of the single crystal to the height of the shoulder from the horizontal growth starting portion of the shoulder becomes 0.3.

For example, the controller 180 may control the pulling speed of the pulling unit such that the height of the upper portion of the horizontal shoulder is 90 mm or more.

The controller 180 may control the pulling speed of the single crystal for growing the shoulder so as to be 1.125-1.375 times the average pulling speed of the single crystal for vertically growing the single crystal. Here, the average pulling speed may be the average of speeds at which the shoulder grows to 70% of the final height of the shoulder.

Figure 3:
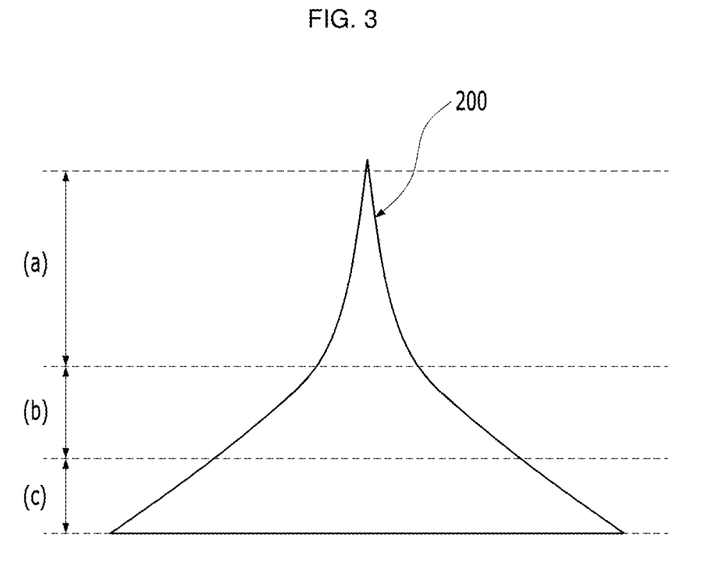
FIG. 3 is a view illustrating the shoulder of a single crystal according to one embodiment of the present invention.

FIG. 3 is a view illustrating the shoulder of a single crystal according to one embodiment of the present invention.

Referring to FIG. 3, a silicon single crystal growth method according to one embodiment of the present invention includes the steps of (a) allowing the shoulder of a single crystal to grow vertically, (b) allowing the shoulder to grow horizontally after the vertical growth, and (c) allowing the shoulder to grow in a downwardly convex shape after the horizontal growth of the shoulder.

In the section (b), the diameter of the growing crystal may be increased by adjusting the pulling speed of the single crystal until the shoulder of the single crystal reaches a desired diameter. The part of the shoulder of the single crystal that is increased in diameter according to the horizontal growth of the shoulder is referred to as a taper or a crown. As the taper is increased to a desired diameter, the crystal may form the upper portion of the shoulder.

In the section (c), the diameter of the shoulder of the single crystal is gradually decreased, and thus the shoulder may have an approximately conical shape which is convex in the growth direction of the shoulder.

Here, after the boundary section between the vertical growth portion and the horizontal growth portion of the shoulder 200, the height of the shoulder 200 from the horizontal growth starting portion of the shoulder 200 up to the point in time when the growth of the shoulder 200 is completed may be the sum of the height of the section (b) and the height of the section (c).

Figure 4A:
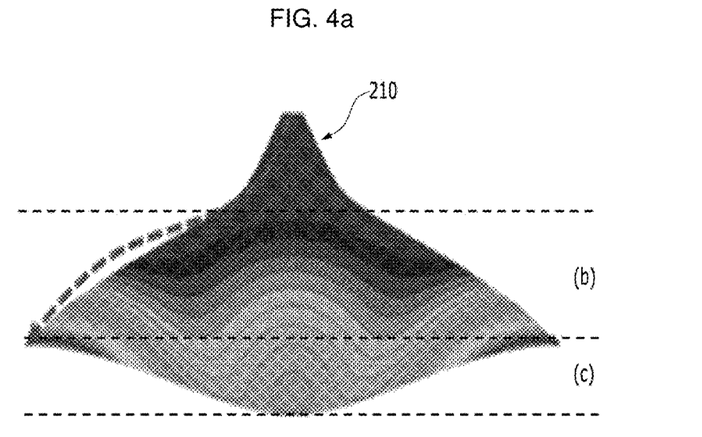
FIGS. 4a to 4c are views illustrating the shapes of first to third shoulders according to embodiments of the present invention.
Figure 4B:
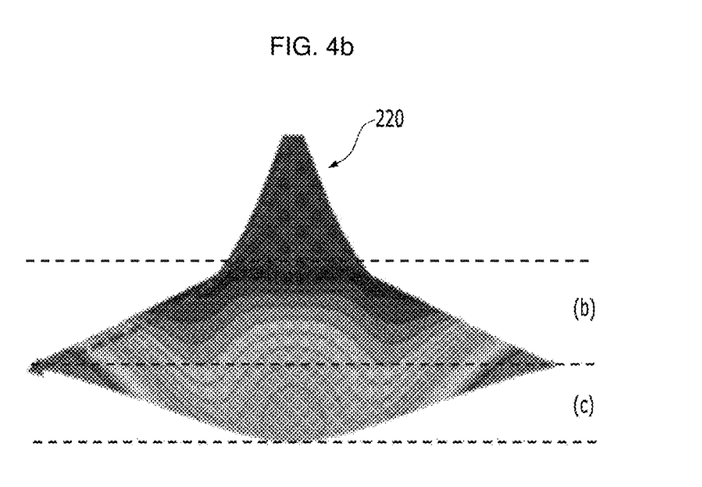
Figure 4C:
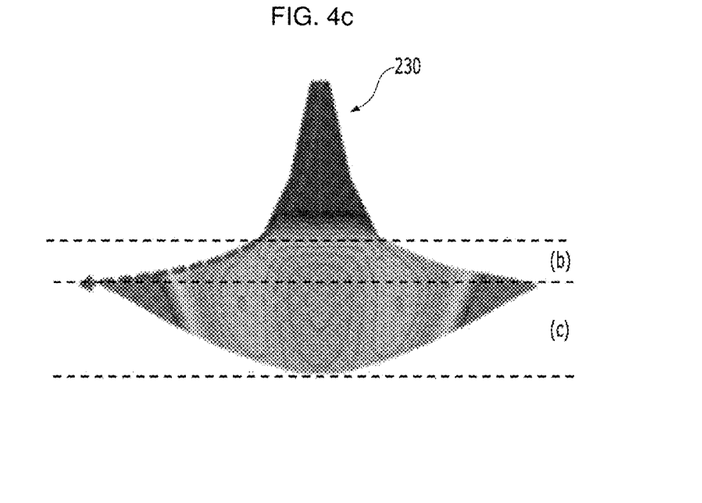

FIGS. 4a to 4c are views illustrating the shapes of first to third shoulders according to embodiments of the present invention.

Referring to FIG. 4a, a section (b) of a first shoulder 210 according to a first embodiment has an upwardly convex shape. Further, the height of the section (b) of the first shoulder 210 may be greater than the height of a section (c) of the first shoulder 210.

Referring to FIG. 4b, the height of a section (b) of a second shoulder 220 according to a second embodiment may be less than the height of the section (b) of the first shoulder 210 according to the first embodiment. Here, the height of a section (c) of the second shoulder 220 may be greater than the height of the section (c) of the first shoulder 210 according to the first embodiment.

Referring to FIG. 4c, the height of a section (b) of a second shoulder 230 according to a third embodiment may be less than the height of the section (b) of the second shoulder 220 according to the second embodiment. Here, the height of a section (c) of the third shoulder 230 may be greater than the height of the section (c) of the second shoulder 220 according to the second embodiment.

According to the shapes of the shoulders 210, 220 and 230 according to the first to third embodiments, as the height of the section (b) of the shoulder 200 decreases, the height of the section (c) may increase.

The decrease in the height of the section b of the shoulder 200 may mean that the horizontal growth of the shoulder 200 is very rapidly carried out. Further, as the section (b) becomes flat, heat may be effectively emitted, and thus the section (c) may have a more downwardly convex shape.

As the section (c) becomes more convex downwardly, a GAP between the center and the edge of the single crystal may be widened. Therefore, an oxygen concentration difference between the center and the edge of the single crystal may be increased.

Table 1 below shows oxygen gradients according to the first to third embodiments.

TABLE 1

|  | Case 1 | Case 2 | Case 3 |
| --- | --- | --- | --- |
| Height of section (b) | 90 mm | 80 mm | 50 mm |
| Height of section (c) | 50 mm | 60 mm | 80 mm |
| Oxygen gradient | 0.3 | 0.5 | 0.9 |

From the Table 1, in the first embodiment, the height of the section (b) may be about 90 mm. Here, the height of the section (c) may be 50 mm. Further, the oxygen gradient may be 0.3. In addition, the oxygen gradient may be a difference between Oi.c and Oi.e. Oi.c may indicate an oxygen concentration at the center of a wafer. Oi.e may indicate an oxygen concentration at the edge of the wafer. The oxygen gradient may be a difference between the oxygen concentration at the center of the wafer and the oxygen concentration at the edge of the wafer.

In the second embodiment, the height of the section (b) may be about 80 mm. The height of the section (c) may be 60 mm. Here, the oxygen gradient may be 0.5.

In the third embodiment, the height of the section (b) may be about 50 mm. The height of the section (c) may be 80 mm. Here, the oxygen gradient may be 0.9.

Figure 5:
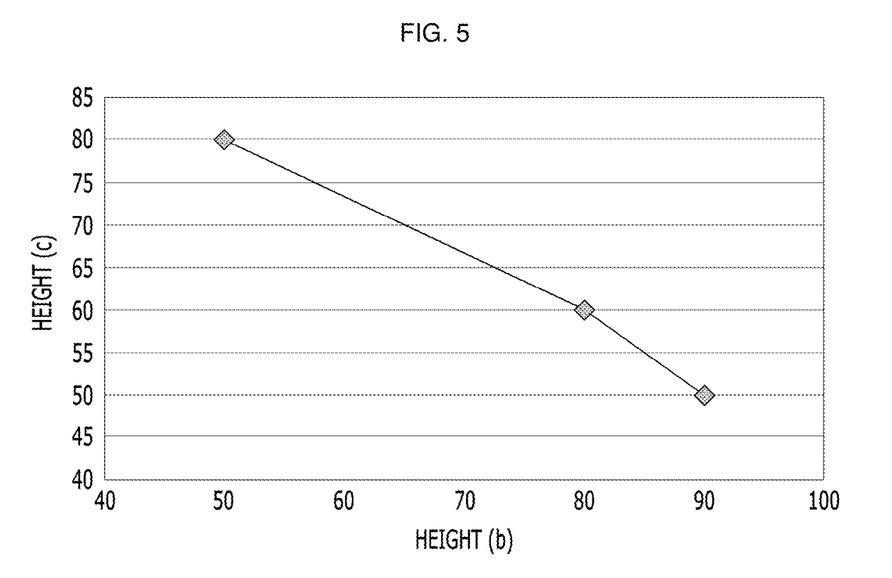
FIG. 5 is a graph showing the relationship between the height of a section (b) and the height of a section (c) described above in a silicon single crystal growth method according to the embodiments shown in FIGS. 4a to 4c.

FIG. 5 is a graph showing the relationship between the height of the section (b) and the height of the section (c) described above in the silicon single crystal growth method according to the embodiments shown in FIGS. 4a to 4c. In the graph shown in FIG. 5, the x-axis indicates the height of the section (b), and the y-axis indicates the height of the section (c).

Referring to FIG. 5, it may be confirmed that, as the height of the section (b) of the shoulder 200 increases, the height of the section (c) decreases. Further, it may be confirmed that, as the height of the section (c) increases, the height of the section (b) decreases. Therefore, since the oxygen gradient increases as the height of the section (c) increases, the height of the section (c) may be decreased so as to decrease the in-plane oxygen gradient of the wafer.

Figure 6:
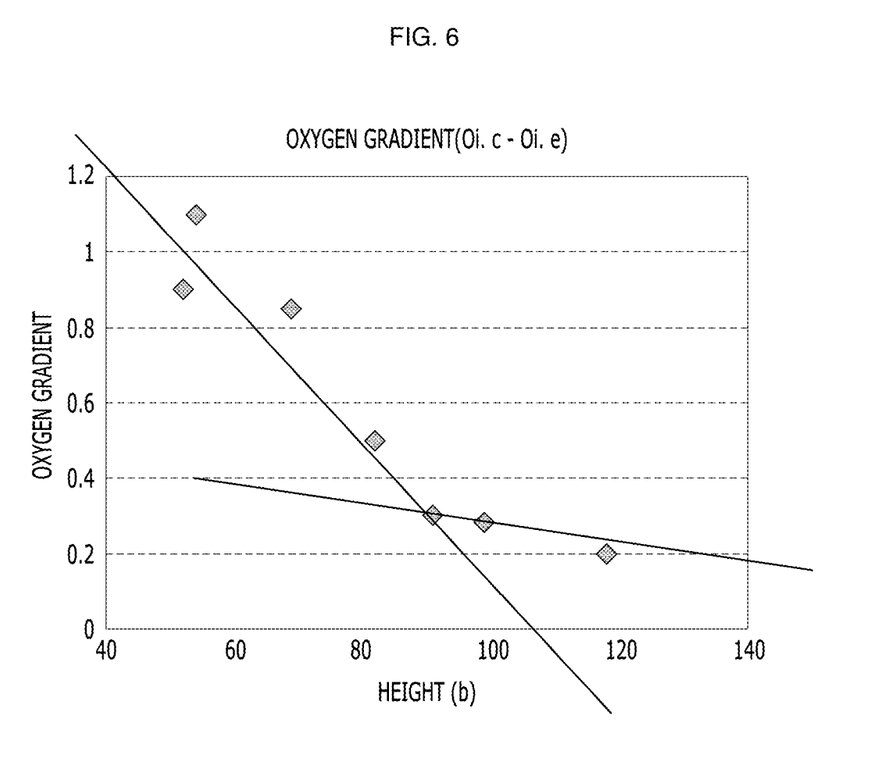
FIG. 6 is a graph showing the relationship between the height of the section (b) of the shoulder according to one embodiment of the present invention and an oxygen gradient.

FIG. 6 is a graph showing the relationship between the height of the section (b) of the shoulder according to one embodiment of the present invention and the oxygen gradient.

In the graph shown in FIG. 6, the X-axis indicates the height of the section (b), and the y-axis indicates the oxygen gradient.

Referring to FIG. 6, as the height of the section (b) of the shoulder 200 increases, the oxygen gradient may decrease. Here, when the height of the section (b) is 90 mm or more, the oxygen gradient may exhibit a stable level, and when the height of the section (b) is 90 mm or less, the value of the oxygen gradient may be suddenly increased. As the value of the oxygen gradient is increased, an oxygen concentration gradient of the wafer in the in-plane direction may be deteriorated, and as the value of the oxygen gradient is decreased, good quality may be obtained.

Therefore, by growing the shoulder so that the height of the section (b) is 90 mm or more, a single crystal having good quality may be acquired.

Figure 7:
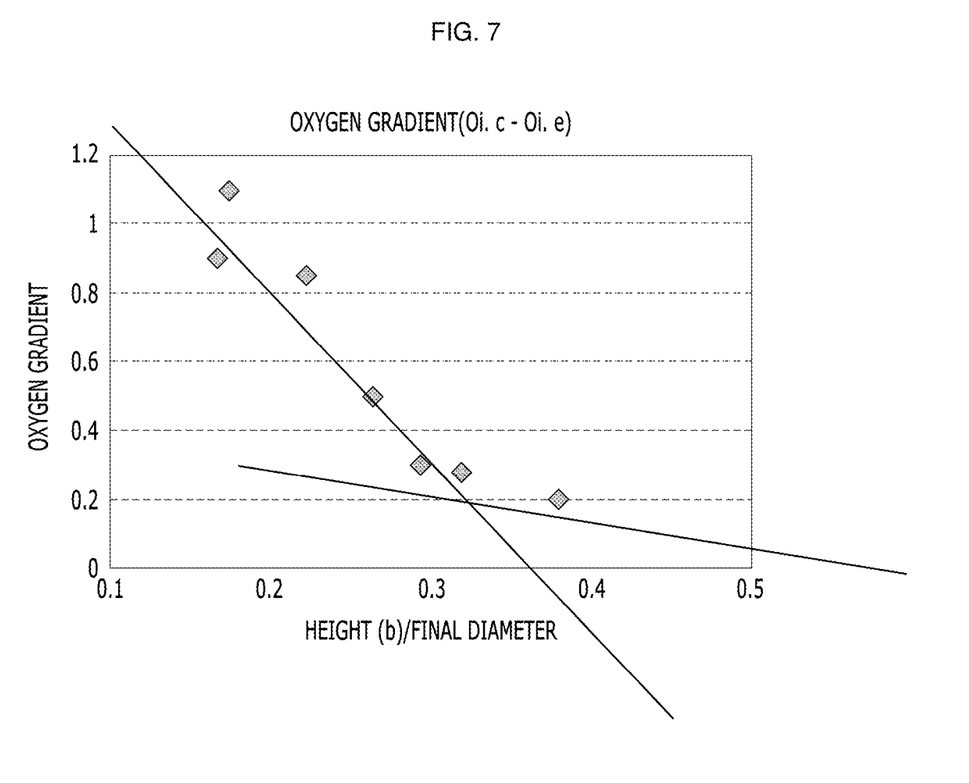
FIG. 7 is a graph showing the relationship among the height of the section (b), the final diameter of the shoulder according to one embodiment of the present invention and the oxygen gradient.

FIG. 7 is a graph showing the relationship among the height of the section (b), the final diameter of the shoulder according to one embodiment of the present invention and the oxygen gradient.

In the graph shown in FIG. 7, the x-axis indicates a value acquired by dividing the height of the section (b) by the final diameter of the shoulder, and the y-axis indicates the oxygen gradient.

Table 2 below shows the relationship among the height of the section (b), the final diameter of the shoulder and the oxygen gradient in the silicon single crystal growth method according to the embodiment of FIG. 6.

TABLE 2

| Height of section (b)/final diameter | Oxygen gradient |
|---|---|
| 0.29 | 0.3 |
| 0.26 | 0.5 |
| 0.17 | 0.9 |
| 0.32 | 0.28 |
| 0.22 | 0.85 |
| 0.38 | 0.2 |

Referring to Table 2, when the above-described value of the height of the section (b)/the final diameter of the shoulder 200 is 0.29, the oxygen gradient may be 0.3. When the value of the height of the section (b)/the final diameter is 0.26, the oxygen gradient may be 0.5. When the value of the height of the section (b)/the final diameter is 0.17, the oxygen gradient may be 0.9. When the value of the height of the section (b)/the final diameter is 0.32, the oxygen gradient may be 0.28. When the value of the height of the section (b)/the final diameter is 0.22, the oxygen gradient may be 0.85. When the value of the height of the section (b)/the final diameter is 0.38, the oxygen gradient may be 0.2. Therefore, in the silicon single crystal growth method according to one embodiment of the present invention, the shoulder 200 may be grown such that the ratio of the final diameter of the shoulder to the height of the section (b) is 0.3 or more. Thereby, the in-plane oxygen concentration of the wafer according to the silicon single crystal growth method may be stably controlled.

In the silicon single crystal growth method according to this embodiment, when the shoulder 200 of the single crystal is vertically grown, the average pulling speed up to 70% of the height of the shoulder 200 in the vertical growth step may be calculated. The average pulling speed may be a first pulling speed.

Therefore, in the silicon single crystal growth method, the shoulder 200 may be grown at a second pulling speed in the shoulder horizontal growth section, different from the first pulling speed.

For example, the controller 180 may control the second pulling speed such that the height of the section (b) is maintained at 90 mm or more.

Table 3 shows the relationship among the first pulling speed, the second pulling speed and the height of the section (b) in the silicon single crystal growth method according to this embodiment.

TABLE 3

| First P/S | Second P/S | Ratio (second P/S/first P/S) | Height of section (b) |
|---|---|---|---|
| 0.8 | 0.7 | 0.875 | 52 |
| 0.8 | 0.75 | 0.9375 | 54 |
| 0.8 | 0.8 | 1 | 69 |
| 0.8 | 0.85 | 1.0625 | 82 |
| 0.8 | 0.9 | 1.125 | 91 |
| 0.8 | 1 | 1.25 | 99 |
| 0.8 | 1.1 | 1.375 | 118 |

From Table 3, if the first pulling speed in the vertical growth section is fixed to 0.8 and the pulling speed in the horizontal growth section is 0.9, the second pulling speed may be 1.125 times the first pulling speed and, in this case, the height of the section (b) may be 91 mm. If the first pulling speed in the vertical growth section is fixed to 0.8 and the pulling speed in the horizontal growth section is 1, the second pulling speed may be 1.25 times the first pulling speed and, in this case, the height of the section (b) may be 99 mm.

If the first pulling speed in the vertical growth section is fixed to 0.8 and the pulling speed in the horizontal growth section is 1.1, the second pulling speed may be 1.375 times the first pulling speed and, in this case, the height of the section (b) may be 118 mm.

That is, the second pulling speed according to one embodiment of the present invention may be 1.125-1.375 times the first pulling speed.

Therefore, in the silicon single crystal growth method according to one embodiment of the present invention, the single crystal may grow such that the oxygen concentration gradient of the single crystal in the in-plane direction is 0.3 or less based on the first growth speed in the vertical growth section of the single crystal and the second growth speed in the horizontal growth section of the single crystal.

Although embodiments have been described with reference to a number of illustrative embodiments thereof, it should be understood that numerous other modifications and embodiments can be devised by those skilled in the art that will fall within the spirit and scope of the principles of the invention.

Thus, it is intended that the present invention cover the modifications and variations of this invention provided they fall within the scope of the appended claims and their equivalents.

INDUSTRIAL APPLICABILITY

A silicon single crystal growth method and apparatus according to embodiments is usable in a manufacturing process of a silicon single crystal, etc.

The invention claimed is:

1. A silicon single crystal growth method comprising steps of:
   (a) allowing a shoulder of a single crystal to grow vertically;
   (b) allowing the shoulder to grow horizontally after the vertical growth; and
   (c) allowing the shoulder to grow in a downwardly convex shape after the horizontal growth of the shoulder,
   wherein the shoulder grows to realize a preset ratio between a final diameter of the shoulder and a growth height of the shoulder according to the steps (b) and (c), wherein a ratio of a height of the shoulder grown in the step (b) to the final diameter of the shoulder is 0.3 or more, wherein the shoulder grows at a first pulling speed in the step (a), the shoulder grows at a second pulling speed in the steps (b) and (c), and the second pulling speed is 1.125-1.375 times the first pulling speed, and wherein the first pulling speed is an average pulling speed at which the shoulder reaches 70% of a final height of the shoulder.

2. The silicon single crystal growth method according to claim 1, wherein the height of the shoulder grown in the step (b) is greater than the height of the shoulder grown in the step (c).

3. The silicon single crystal growth method according to claim 1, wherein the height of the shoulder grown in the step (b) is 90 mm or more.

* * * * *